(12) United States Patent
Stimm

(10) Patent No.: US 9,876,261 B2
(45) Date of Patent: Jan. 23, 2018

(54) MONITORING DEVICE FOR A BATTERY, A LITHIUM-ION BATTERY, AND METHOD FOR THE MONITORING OF A BATTERY

(71) Applicant: Robert Bosch GmbH, Stuttgart (DE)

(72) Inventor: Frank Stimm, Stuttgart (DE)

(73) Assignee: Robert Bosch GmbH, Stuttgart (DE)

(*) Notice: Subject to any disclaimer, the term of this patent is extended or adjusted under 35 U.S.C. 154(b) by 217 days.

(21) Appl. No.: 14/919,335

(22) Filed: Oct. 21, 2015

(65) Prior Publication Data

US 2016/0111758 A1  Apr. 21, 2016

(30) Foreign Application Priority Data

Oct. 21, 2014 (DE) .................... 10 2014 221 272

(51) Int. Cl.
| | |
|---|---|
| *H01M 10/44* | (2006.01) |
| *H01M 10/46* | (2006.01) |
| *H01M 10/48* | (2006.01) |
| *H01M 10/0525* | (2010.01) |
| *G01R 31/36* | (2006.01) |

(52) U.S. Cl.
CPC ........ *H01M 10/482* (2013.01); *G01R 31/362* (2013.01); *G01R 31/3658* (2013.01); *G01R 31/3662* (2013.01); *H01M 10/0525* (2013.01); *H01M 10/486* (2013.01); *H01M 2220/20* (2013.01); *Y02E 60/122* (2013.01); *Y02P 70/54* (2015.11); *Y02T 10/7011* (2013.01)

(58) Field of Classification Search
CPC ...... H02J 7/0013; H02J 7/0016; H02J 7/0021; H02J 7/0026

USPC ........ 320/107, 116, 122, 132, 149, 150, 153
See application file for complete search history.

(56) References Cited

U.S. PATENT DOCUMENTS

| | | | | |
|---|---|---|---|---|
| 2010/0244847 A1* | 9/2010 | Kudo | ................. | B60L 3/0046 |
| | | | | 324/433 |
| 2012/0038315 A1* | 2/2012 | Wong | ................. | H02J 7/0018 |
| | | | | 320/107 |
| 2012/0187898 A1* | 7/2012 | Nysen | ................. | H01M 10/052 |
| | | | | 320/103 |

(Continued)

FOREIGN PATENT DOCUMENTS

| | | |
|---|---|---|
| DE | 3438783 | 12/1985 |
| DE | 102010062856 | 6/2012 |

(Continued)

*Primary Examiner* — Edward Tso
(74) *Attorney, Agent, or Firm* — Michael Best & Friedrich LLP

(57) ABSTRACT

A monitoring device for a battery, a lithium-ion battery with the monitoring device and a method for the monitoring of a battery, wherein the battery is provided with a plurality of cell composites comprising a number of mutually parallel-interconnected battery cells. The cell composites are also interconnected by means of electrical cell couplers, and one or more temperature sensors are arranged between the cell composites. Where a voltage drop across one or more of the battery cells on the electrical cell couplers exceeds a predetermined value and, simultaneously, a temperature occurs on at least one of the temperature sensors which exceeds a predetermined value, a fault signal is generated. The defective battery cell can then be isolated from the cell composite.

10 Claims, 2 Drawing Sheets

(56) References Cited

U.S. PATENT DOCUMENTS

| | | | | |
|---|---|---|---|---|
| 2012/0187907 | A1* | 7/2012 | Nysen | H01M 10/052 |
| | | | | 320/116 |
| 2013/0082661 | A1* | 4/2013 | Bohan, Jr. | H01M 10/4221 |
| | | | | 320/134 |
| 2013/0300373 | A1* | 11/2013 | Vivanco-Sarabia | H02J 7/0014 |
| | | | | 320/134 |
| 2014/0302355 | A1 | 10/2014 | Boehm et al. | |
| 2015/0054467 | A1* | 2/2015 | Takano | H01M 10/48 |
| | | | | 320/136 |

FOREIGN PATENT DOCUMENTS

| | | |
|---|---|---|
| DE | 102012201528 | 8/2013 |
| WO | 9010334 | 9/1990 |

\* cited by examiner

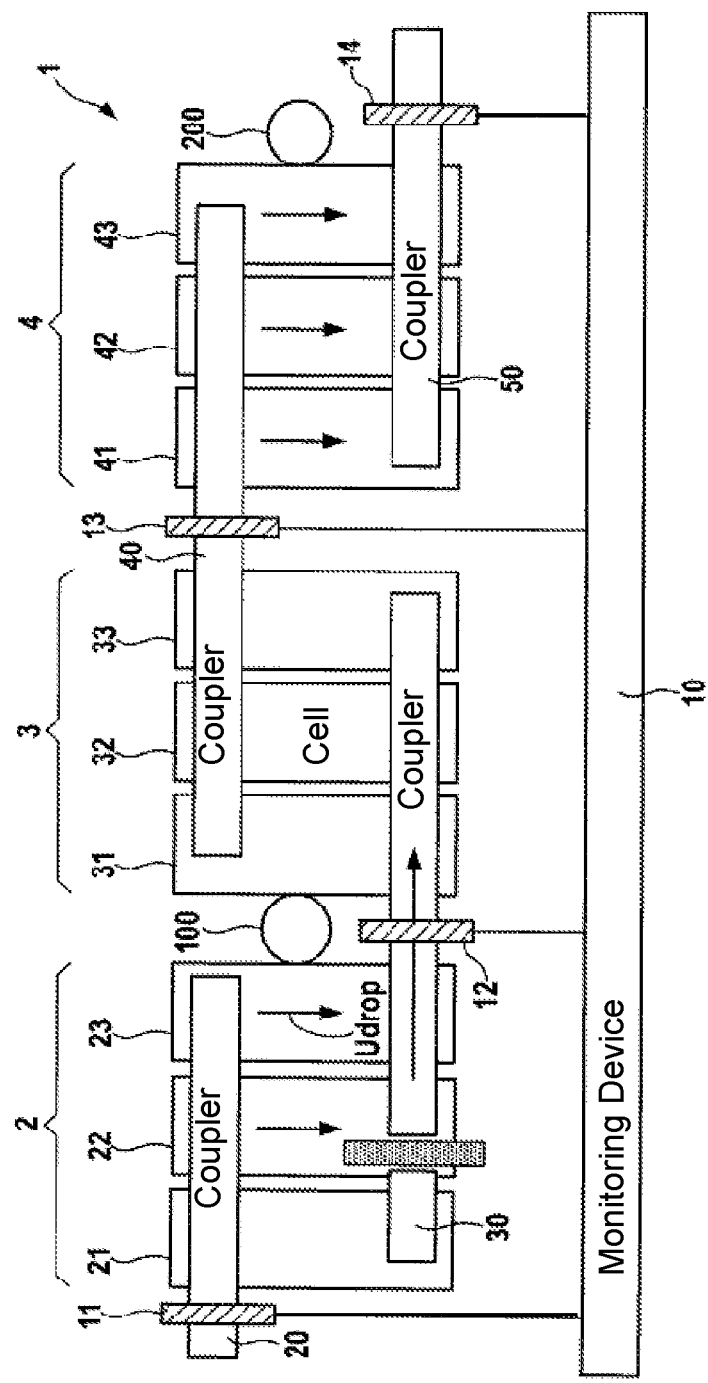

MONITORING DEVICE FOR A BATTERY, A LITHIUM-ION BATTERY, AND METHOD FOR THE MONITORING OF A BATTERY

BACKGROUND OF THE INVENTION

The present invention relates to a monitoring device for a battery, a lithium-ion battery, and a method for the monitoring of a battery.

In electrically-powered vehicles, an accumulator or a battery is increasingly used as an energy source, either of which is comprised of a number of battery cells. Battery cells using lithium chemistry are often used for this purpose on the grounds that, in comparison with nickel- or lead-based batteries, the latter deliver the highest energy density available to date, with the lowest weight. In order to achieve the requisite power and energy ratings, a number of battery cells are typically connected in series. Increasingly, in response to the dictates of energy capacity or requirements for the delivery of higher power, battery cells are also connected in parallel. In total, the open-circuit voltage of the entire system is of the order of several hundred volts. Where battery cells are connected in series, a short-circuit on the vehicle-side battery pole but also, in the case of specific cell arrangements, a short-circuit on elements of the battery may lead to the flow of very high currents of up to several thousand amperes. Given that 60 volts is classified as the safe voltage for human beings, short-circuits in series circuits may result in the endangerment of persons, in case of accidents.

The failure of one cell in a parallel-connected cell composite may result in the endangerment especially of the remaining unaffected cells, and may cause the premature aging of the battery. In case of the failure of one cell in a parallel-connected cell composite, current flows in the remaining cells, resulting in the heat-up of the latter. In this case, the voltage on the remaining cells may show a normal voltage value, as a result of which the failure cannot be detected in the manner which would apply to a series circuit.

In a parallel circuit of battery cells, according to the prior art, a coupler or center tap is provided between two or more of the cells, which measures a differential voltage between the cells. Provided that the differential voltage is zero, it can be assumed that the cells are free of any operating defect. This proceeds from the fact that, in case of a fault, the voltage will no longer be evenly distributed between the cells, such that the differential voltage upon the occurrence e.g. of a short-circuit, or in case of an increase in internal resistance associated with the failure of a cell, or in case of any other faults, will no longer be zero. This can be measured and, on the basis of the magnitude and the polarity of the differential voltage, the nature of the fault and the defective part of the battery can be identified.

This fault identification is known, for example, from DE 3438783 C1. DE 3438783 C1 discloses a monitoring device for a battery with at least two parallel-connected branches, each of which comprises cell rows of m+n cells. This monitoring device can detect faults in the operation of the battery and the failure of individual battery cells, whereby a battery of symmetrical structure is required for this purpose. To this end, in at least two of the parallel-connected cell rows of the battery, between at least the $m^{th}$ and the $(m+1)^{th}$ cell respectively, a center tap is connected for an electrical measurement line, which is connected to a circuit arrangement for the measurement of a differential voltage. According to the disclosure of DE 3438783 C1, the differential voltage permits conclusions to be drawn with regard to the condition of the battery elements, and consequently of the cell rows. Provided that both cell rows and their constituent individual cells are operating in a fault-free manner, the differential voltage in all steady-state operating conditions will be equal to zero. Upon the occurrence of a short-circuit in a cell, an increase in the internal resistance of a cell, a contact fault between two cells, and the overloading or exhaustive discharge of a cell, the differential voltage will deviate from zero. From the magnitude and polarity of the differential voltage, and from the relevant operating state of the battery, it is possible to identify the nature of the fault and the battery element in which the fault has occurred.

Printed publication WO 90/10334 A1 also discloses a circuit for the monitoring of a rechargeable battery with parallel-connected battery cells. To this end, the circuit is configured for the monitoring of voltage differentials between the parallel branches and, in the event of a deviation which exceeds a predetermined threshold, for the generation of a fault signal. According to the disclosure of WO 90/10334 A1, a defective battery is also affected by heat-up, such that a thermal release may be provided for protection against overheating.

From printed publications DE 102012201528 A1 and DE 102010062856 A1, it is also known that the temperature of battery cells is determined by means of temperature sensors, whereby it is also proposed that a check should be executed in order to confirm that the recorded operating parameters lie within permissible ranges.

More specifically, DE 102012201528 A discloses a method for the monitoring of the temperature of a temperature-sensitive system, specifically a battery pack with series- and/or parallel-connected storage cells. To this end, for the recording of the temperature of battery cells, temperature sensors or temperature-responsive resistors are arranged on the battery cells.

DE 102010062856 A1 discloses a method for the determination of the operating parameters of a battery, a battery management system, and a battery. The battery management system is provided with means for the measurement of operating parameters, for example the battery voltage, battery current and battery temperature. Permissible operating ranges for various battery state variables, including temperature, state of charge, aging and current intensity, each with reference to the other operating parameters, are stored in a memory. A device is also provided for the predetermination of the requisite operating properties of the battery. In summary, DE 102010062856 A1 proposes a system or a calculation method whereby the monitoring of appropriate parameters, including temperature, state of charge or current intensity, is performed, such that the working point does not lie outside the permissible operating range, thereby resulting in the more rapid aging of the battery and, accordingly, a shorter service life of the battery.

SUMMARY OF THE INVENTION

According to the invention, a monitoring device for a battery is disclosed, wherein the battery is provided with a number of cell composites comprising a number of mutually parallel-connected battery cells, whereby the cell composites are mutually interconnected by means of electrical cell couplers, and whereby one or more temperature sensors are arranged between the cell composites. The invention is characterized in that the monitoring device generates a fault signal in response to a voltage drop across one or more of the battery cells on the electrical cell couplers in excess of a predetermined value and, simultaneously, the occurrence on at least one of the temperature sensors of a temperature which exceeds a predetermined temperature.

The monitoring device according to the invention has an advantage over devices known from the prior art in that, by the association of the measurement of a temperature increase in a cell with the measurement of an increased differential voltage in a cell, a more rapid and reliable disconnection thereof can be achieved than was previously possible. This is even possible where the temperature sensors are not arranged between each cell composite, as the temperature drop up-circuit of the temperature sensor is nevertheless validated with reference to the measured voltage drop, i.e. an increased differential voltage, thereby permitting the correct identification of a defective cell.

In known monitoring devices, there is frequently a time delay between fault detection and disconnection on the grounds that, for example, for reasons of cost, not every cell incorporates a temperature sensor for the indication of a temperature increase in the cell. One reason for a delay in disconnection may be that, while an installed temperature sensor may show significantly raised values even at normal temperatures, which would initiate disconnection, the values from one sensor are validated by comparison with a number of sensors, for example three sensors, and consequently one cell will only be recognized as defective and disconnected in case of a clear deviation between the temperature of that sensor and that of the other sensors considered for comparison. This may occur too late, such that further cells will already be jeopardized by the higher temperature loading, or may even already be defective.

According to the invention, a property is exploited whereby, in parallel-connected cells, the occurrence of a fault alters a number of parameters and, by reference to a combination of specific alterations in the parameters, more secure and more rapid fault detection can be achieved, thereby permitting more rapid, and simultaneously more reliable disconnection. In case of a fault, where cells are connected in parallel, current will only continue to flow in the non-defective cells. Accordingly, the current per cell increases, and the voltage drop associated with internal resistance is higher in comparison with the other parallel-connected cells. Capacitance is also reduced, thereby exacerbating this effect still further. At the same time, the temperature of the cell composite incorporating the defective cell rises, as a result of the increased current flowing per cell.

By the combined consideration of voltage drop and temperature increase as parameters, or the measurement of an increased temperature in a defective cell, it is therefore possible to overcome the disadvantage of monitoring devices from the prior art, and to achieve the rapid and reliable disconnection of as many defective parallel-connected cells as required.

In an advantageous configuration, at least one temperature sensor is arranged respectively between two adjoining cell composites. The measurement of the voltage drop and the increased temperature is then executed on adjoining battery cells. This has an advantage in that, by the association thereof, the measurement of the differential voltage and, accordingly, of the voltage drop in the event of a defective cell, and of the temperature which, in the event of a fault, will significantly increase specifically in that cell in which a differential voltage is measured, can be achieved. Accordingly, the reliable and rapid detection of a defective cell is possible, thereby permitting the reliable and rapid disconnection of the cell or the isolation thereof from the cell composite.

Alternatively, it is possible that a temperature sensor is not arranged between all the adjoining cell composites. This has an advantage, in that the installation of fewer sensors is required, thereby saving space and permitting the production of a more cost-effective battery.

Notwithstanding the inclusion of fewer sensors, the association of measured values for the differential voltage and temperature or temperature increase in a cell permits accurate and rapid fault detection, and the disconnection of the defective cell.

In an advantageous further development, the monitoring device is provided with one or more disconnecting devices, by means of which the battery cell or battery cells for which a fault signal has been generated are isolated from the cell composite. This has an advantage in that, by rapid isolation, fault-free operation can be maintained in the remainder of the battery, and the fault cannot be propagated in further cells.

In an advantageous further development, a number of coils in one or more cells are connected in parallel. Here again, the rapid and reliable disconnection of the defective coil can be achieved. The invention also relates to a lithium-ion battery, specifically for a vehicle, which incorporates the monitoring device according to the invention.

The invention also relates to a method for the monitoring of a battery with a plurality of cell composites, which are connected by means of electrical cell couplers, comprising a number of mutually parallel-connected battery cells, and temperature sensors arranged between the cell composites, whereby the voltage across each battery cell in each cell composite is measured. By this arrangement, in the event of the measurement of a voltage drop across at least one of the battery cells on the electrical cell couplers which exceeds a predetermined value, and the simultaneous measurement, by at least one of the temperature sensors, of a temperature which exceeds a predetermined temperature, the association of the two defective values generates a fault signal, and the affected battery cell(s) is (are) isolated from the cell composite.

Advantageously, at least one temperature sensor is arranged respectively between two adjoining cell composites. The measurement of the voltage drop and the increased temperature is then executed on adjoining battery cells. Alternatively, it is possible that a temperature sensor is not arranged between all the adjoining cell composites. According to this method, one or more battery cells may comprise a plurality of coils, which are connected in parallel.

BRIEF DESCRIPTION OF THE DRAWINGS

The invention, and advantageous configurations thereof according to the characteristics of the dependent claims, are described in greater detail hereinafter with reference to the exemplary embodiments represented in the drawings, with no resulting limitation of the invention. In the drawings:

FIG. 2 shows a monitoring device according to the invention in the event of a fault, in accordance with one exemplary embodiment of the invention.

DETAILED DESCRIPTION

Figure 1:
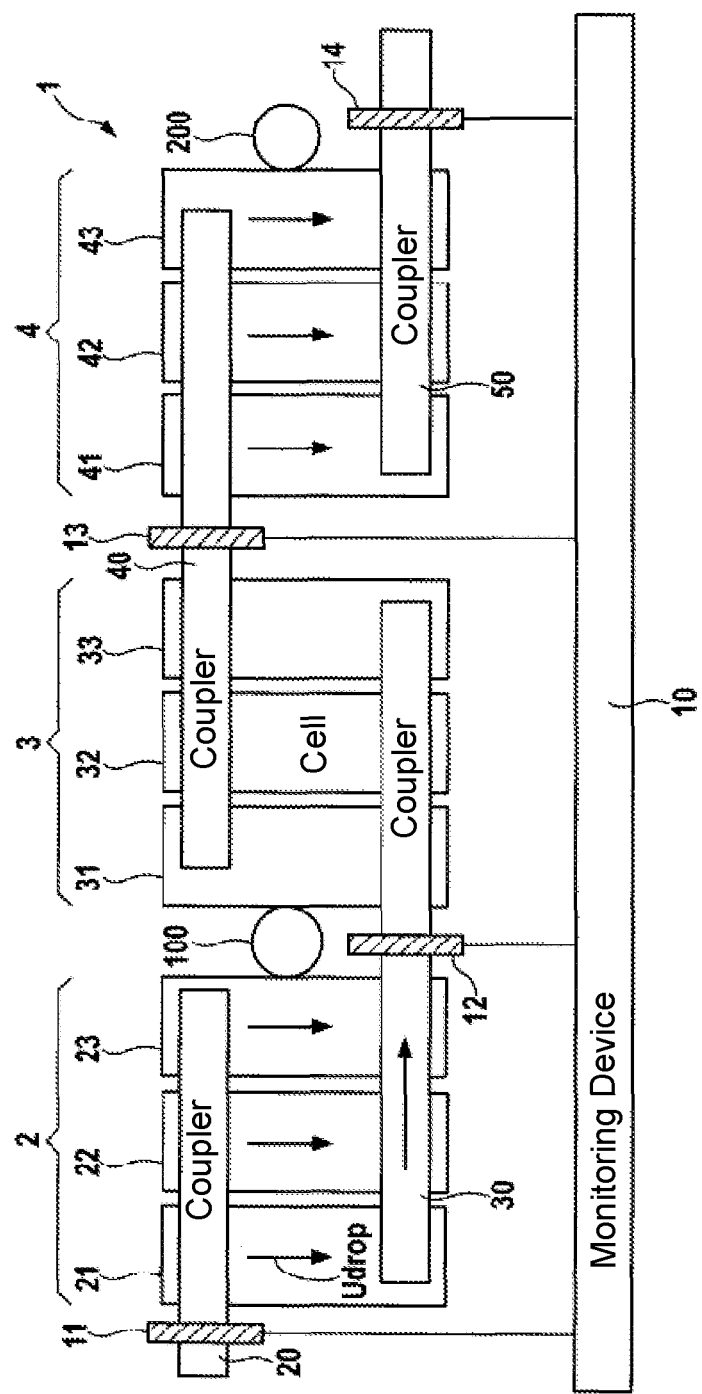
FIG. 1 shows a schematic representation of a monitoring device according to the invention.

Batteries according to the invention are preferably used in electrically-powered or hybrid vehicles. The preferred type of battery is a lithium-ion battery on the grounds that, in comparison with nickel- or lead-based batteries, it combines the highest available energy density to date with minimum weight and, is best-suited for the drive system of a vehicle.

A key component of batteries is a monitoring device 10, which isolates one or more defective battery cells 21, 22, 23; 31, 32, 33; 41, 42, 43 from the remainder of the battery composite, thereby preventing more severe damage to the entire battery.

FIG. 1 shows a monitoring device 10 for a battery 1, wherein the battery 1 comprises a number of cell composites 2, 3, 4, each of which in turn is provided with a number of mutually parallel-connected battery cells 21, 22, 23; 31, 32, 33; 41, 42, 43 and electrical cell couplers 20, 30, 40, 50, by means of which the number of battery cells 21, 22, 23; 31, 32, 33; 41, 42, 43 are interconnected. Temperature sensors 100, 200 are also arranged between the cell composites 2, 3, 4. The temperature sensors 100, 200 in FIG. 1 are arranged such that a temperature sensor is not arranged between every cell composite 2, 3, 4 whereby, in an alternative which is not represented here, a temperature sensor 100, 200 is arranged between every cell composite 2, 3, 4. The arrangement of temperature sensors 100, 200 is dictated by various criteria including, for example, a given price, the availability of a given space for the battery as a whole, a given sensitivity, or other criteria which are applied in the automobile industry. For the isolation of defective battery cells 21, 22, 23; 31, 32, 33; 41, 42, 43 or defective cell composites 2, 3, 4, disconnecting devices 11, 12, 13, 14 are provided, which are controlled by the monitoring device 10.

The electrical cell couplers 20, 30, 40, 50 are configured as electrical measurement lines on which, by means of an associated measuring device (not represented), a differential voltage between individual battery cells 21, 22, 23; 31, 32, 33; 41, 42, 43 and between the cell composites 2, 3, 4 can be measured. From a measured differential voltage, it is possible to draw conclusions with regard to the state of the battery. Provided that no fault is present on one of the cells, the differential voltage in all operating states should be equal to zero, or should show the same value in all cells.

In addition, the temperature sensors 100, 200 arranged between cell composites measure the temperature on the battery cells 21, 22, 23; 31, 32, 33; 41, 42, 43 or cell composites 2, 3, 4. As soon as a cell is defective, the current flowing in the remaining cells increases, and the voltage drop associated with internal resistance is higher. In this case, the capacitance of a defective cell is also reduced, thereby further exacerbating the effect of heat-up.

Whereas, in circuits not provided according to the invention, it is preferred that temperature sensors should be arranged at least between every cell composite, temperature sensors according to the invention do not need to be arranged on every cell composite or on every individual cell. In a circuit not provided according to the invention, the arrangement thereof on at least every cell composite is necessary on the grounds that the validation of measured values from temperature sensors generally proceeds on the basis, for example, of three sensors. This method is relatively slow, as it involves a comparison of a number of measured temperature values and, in the case of an incorrect measurement on one of the other temperature sensors considered for the purposes of validation, may also result in an incorrect or excessively delayed action.

By the association, according to the invention, of the measurement of differential voltage and temperature, notwithstanding a limited number of temperature sensors, it is possible to achieve the reliable and rapid disconnection of defective cells, wherein the voltage analysis, i.e. the measurement of differential voltages, is applied as a quasi-validation method for recorded deviations in measured temperature values. Accordingly, by the association with voltage, rather than with further temperature sensors, it is possible to identify a temperature increase in a cell which is arranged remotely from a temperature sensor as a defect, even where the temperature has dropped again by the time it reaches the temperature sensor. This can even be applied as a calculation base for the detection of the defective cell, whereby the calculation method is known to those skilled in the art.

FIG. 2 shows the battery 1 with the monitoring device 10, as represented in FIG. 1, under fault conditions. For example, one of the battery cells 21 of the cell composite 2 is defective. As a result, a higher current flows in the remaining battery cells 22, 23, and the differential voltage measured on the electrical cell couplers 20, 30 deviates from zero, thereby resulting in an increased voltage drop $U_{drop}$ across the internal resistances. This means that only a voltage measurement across defective cells shows a higher voltage drop $U_{drop}$. This voltage drop is measured, and a fault signal is transmitted by the monitoring device 10, for example to a control system, which is capable of initiating the disconnection of the defective cell by the tripping of one of the disconnecting devices 11, 12, 13, 14. It is also possible that only an optical or acoustic signal is generated, without the initiation of direct disconnection.

Where an excessively high temperature is simultaneously measured by the temperature sensor 100, a (fault) signal is also generated, and there is a resulting association with the measured differential voltage $U_{drop}$, by means of which the fault is validated. Where a defective cell is present, $U_{drop}$ shows an increased value, and the temperature measured on the temperature sensor 100, 200 also shows a deviation. As soon as this voltage drop $U_{drop}$ deviates clearly from the voltage drop $U_{drop}$ on the other cells, i.e. an increased differential voltage is measured, it can be detected, in combination with the deviation on the temperature sensor 100, 200, that an electrical coupler 20, 30, 40, 50 is defective, and the cells 21, 22, 23; 31, 32, 33; 41, 42, 43 are disconnected accordingly. The magnitude of the voltage drop is dependent upon the type of battery 1, the number of parallel-connected batteries, and the capacitance or the structure of the battery 1. A person skilled in the art will be able to adapt the monitoring device 10 according to the invention to the battery 1, such that fault detection proceeds on the basis of the battery used.

The monitoring device 10 according to the invention can preferably be used in a lithium-ion battery. Lithium-ion batteries are the preferred option for electrically-powered vehicles, such as cars, but can also be used in other applications. By means of the monitoring device 10 according to the invention, it is possible to achieve the secure and rapid disconnection of defective battery cells 21, 22, 23; 31, 32, 33; 41, 42, 43 in a lithium-ion battery such that, insofar as possible, no further cells 21, 22, 23; 31, 32, 33; 41, 42, 43 become defective as a result of delayed disconnection.

The method for the monitoring of a battery with a plurality of cell composites, which are connected by means of electrical cell couplers, comprising a number of mutually parallel-connected battery cells, and temperature sensors arranged between the cell composites, is characterized in that a voltage drop on one or more cells in a battery is measured and, in addition, the temperature of cells in the cell composite or between the cell composites is measured. These measurements are associated with each other, i.e. in case of the measurement of an increased temperature, for example on one cell composite, and the simultaneous measurement of a voltage drop $U_{drop}$, i.e. an increased differential voltage, in a cell composite, a defective cell is identified and, for example, the disconnection of the defective cell then proceeds on the basis of the associated measured values.

The proposed monitoring device and diagnostic method can be applied to as many defective battery cells as required, to the extent that all cells are identified as defective. In this case, the cell voltage will be equal to zero.

The invention claimed is:

1. A monitoring device (10) for a battery (1), wherein the battery (1) is provided with a number of cell composites (2, 3, 4) comprising a number of mutually parallel-connected battery cells (21, 22, 23; 31, 32, 33; 41, 42, 43), wherein the cell composites (2, 3, 4) are mutually interconnected by means of electrical cell couplers (20, 30, 40, 50), and wherein one or more temperature sensors (100, 200) are arranged between the cell composites (2, 3, 4), characterized in that the monitoring device (10) is configured to generate a fault signal in response to a voltage drop ($U_{drop}$) across one or more of the battery cells (21, 22, 23; 31, 32, 33; 41, 42, 43) on the electrical cell couplers (20, 30, 40, 50) in excess of a predetermined value and, simultaneously, the occurrence on at least one of the temperature sensors (100, 200) of a temperature which exceeds a predetermined temperature.

2. The monitoring device (10) according to claim 1, characterized in that at least one temperature sensor (100, 200) is arranged respectively between two adjoining cell composites (2, 3, 4).

3. The monitoring device (10) according to claim 1, characterized in that not all the adjoining cell composites (2, 3, 4) have one of the temperature sensors arranged therebetween.

4. The monitoring device (10) according to claim 1, characterized in that the monitoring device (10) is provided with one or more disconnecting devices (11, 12, 13, 14), configured to isolate from the cell composite a battery cell (21, 22, 23; 31, 32, 33; 41, 42, 43) or battery cells (21, 22, 23; 31, 32, 33; 41, 42, 43) for which the fault signal has been generated.

5. The monitoring device (10) according to claim 1, characterized in that one or more of the battery cells (21, 22, 23; 31, 32, 33; 41, 42, 43) are provided with a plurality of coils, which are connected in parallel.

6. A lithium-ion battery for a vehicle, the battery comprising a monitoring device (10) according to claim 1.

7. A method for the monitoring of a battery (1) with a plurality of cell composites (2, 3, 4), which are connected by means of electrical cell couplers (20, 30, 40, 50), comprising a number of mutually parallel-connected battery cells (21, 22, 23; 31, 32, 33; 41, 42, 43), and temperature sensors (100, 200) arranged between the cell composites (2, 3, 4), wherein the voltage across each battery cell (21, 22, 23; 31, 32, 33; 41, 42, 43) in each cell composite (2, 3, 4) is measured, the method comprising:

measuring a voltage drop ($U_{drop}$) across at least one of the battery cells (21, 22, 23; 31, 32, 33; 41, 42, 43) on the electrical cell couplers (20, 30, 40, 50);

measuring a temperature with at least one of the temperature sensors (100, 200);

when the measured voltage drop exceeds a predetermined value, thereby providing a first defective value, and simultaneously the measured temperature exceeds a predetermined temperature, thereby providing a second defective value, generating a fault signal by the association of the first and second defective values; and in response to the fault signal, isolating the affected battery cell(s) from the cell composite (2, 3, 4).

8. The method according to claim 7, characterized in that a temperature sensor (100, 200) is arranged respectively between two adjoining cell composites (2, 3, 4).

9. The method according to claim 7, characterized in that a temperature sensor (100, 200) is not arranged between all the cell composites (2, 3, 4).

10. The method according to claim 7, characterized in that one or more of the battery cells (21, 22, 23; 31, 32, 33; 41, 42, 43) are provided with a plurality of coils, which are connected in parallel.

* * * * *